United States Patent [19]
Buck et al.

[11] 4,268,797
[45] May 19, 1981

[54] SELF-PULSED MICROWAVE POWER AMPLIFIER

[75] Inventors: Daniel C. Buck, Hanover; Ricky D. Hess, Annapolis, both of Md.

[73] Assignee: Westinghouse Electric Corp., Pittsburgh, Pa.

[21] Appl. No.: 24,816

[22] Filed: Mar. 28, 1979

[51] Int. Cl.³ .................. H03F 3/193; H03F 3/24
[52] U.S. Cl. .................. 330/277; 330/296; 330/310
[58] Field of Search ............ 330/277, 296, 300, 310

[56] References Cited

U.S. PATENT DOCUMENTS

| | | | |
|---|---|---|---|
| 3,093,740 | 6/1963 | Bush | 330/306 |
| 3,320,365 | 5/1967 | Auernheimer | 330/296 X |
| 3,528,023 | 9/1970 | Jeffers | 330/277 |
| 4,008,442 | 2/1977 | Todokoro | 330/277 |
| 4,037,169 | 7/1977 | Suzuki | 330/277 |
| 4,077,013 | 2/1978 | Moree et al. | 330/296 X |

*Primary Examiner*—James B. Mullins
*Attorney, Agent, or Firm*—H.W. Patterson

[57] ABSTRACT

A pulsed microwave power amplifier for radar transmitters having a class B operated first stage field effect amplifying transistor, which is gate biased to pinch-off in the absence of an input pulse is disclosed. The drain current pulse induced in response to the input RF signal appears as a voltage, which is stepped up through a Ruthroff transformer to turn on a bipolar transistor which switches a gate of a second stage field effect transistor from pinch-off voltage to a voltage corresponding to the drain current substantially equalling $\frac{1}{2}$ $I_{DSS}$ to operate class A for the second stage of amplification. A third stage of amplification may be utilized, wherein its field effect transistor, which is also biased to pinch-off is operated in response to the amplified signal.

7 Claims, 4 Drawing Figures

SELF-PULSED MICROWAVE POWER AMPLIFIER

BACKGROUND OF THE INVENTION

In pulsed radar systems, the pulses generated by the transmitter are amplified by a power amplifier, and then applied to one or more radiating or antenna elements for propagation. The time duration of each of these pulses may be substantially less than the space between them. Thus, in order to conserve power, the amplifier may be switched on or off in synchronism with the generation of each RF pulse. In the past, power amplifiers were pulsed on and off by utilizing separate pulsing circuitry to pulse the grid of an output traveling waveguide tube. Since this tube tended to have a high gain, typically forty dB, for example, such pulsing circuit was relatively insignificant in contributing to the power used by the transmitter.

However, many present day radar systems utilize solid state transistor power amplifiers, which are well known in the art, and any pulsing circuit which turns such amplifiers on and off in synchronism with the generated RF pulses may contribute substantially to the overall power requirements of the transmitter. Also, since it is advantageous to mount such solid state power amplifiers in the antenna to minimize combining losses, any pulsing circuitry requires additional conductors between the antenna and the transmitter. Thus, it is desirable to eliminate such pulsing circuitry with its attendant power requirements and additional conductors.

Conventional solid state power amplifiers, of course, may be pulsed on and off in response to each of the generated RF pulses without the separte pulsing circuitry by using high power field effect transistors, and operating in the class B or class C region; and it has been determined that such pulsing may be accomplished with substantial efficiency in the low and intermediate frequencies, such as up to about three gigahertz. For example, a solid state amplifier using a one micron gate field effect transistor provided a 10dB gain with a one watt output at 2½ gigahertz, which amounted to an increased power added efficiency of approximately 35%. Power added efficiency herein is defined as that percentage of DC drain power input to the transistor which is actually output in the form RF power or RF Power Out−RF Power In/DC Drain Power=Power added efficiency.

However, in radar systems where the RF pulses are of a frequency that may be substantially higher than three gigahertz, such as in X band radar systems, the power added efficiency of such class B operation of the solid state amplifiers using medium to high power field effect transistors, may be substantially reduced. In one example, at a frequency of 8 gigahertz, a power amplifier utilizing a ¼ watt gallium arsenide field effect transistor, which produced approximately a 4.1dB gain, provided only a 21% power added efficiency. Such decreased efficiency at the higher frequencies is believed due to various solid state technology problems, gate circuit resistance, for example, which do not permit low pinch-off voltages, high power, and gain.

Therefore, it is desirable to be able to provide power amplifiers for pulsed radar transmitters that turn on and off in response to the presence and absence of the generated RF pulse, using power field effect transistors that operate at class B or below; and which provide efficiency not only at the lower and intermediate frequencies, but at the higher X band frequencies as well.

SUMMARY OF THE INVENTION

In accordance with the present invention, a pulsed power amplifier for a radar transmitter, which is capable of being turned on and off in response to the respective presence and absence of an RF pulse is provided. Such an amplifier includes a low level input stage using a low power amplifying transistor that operates preferably at class B, but may in some instances, operate in what may be termed the class C region, and at least one subsequent amplification stage that operates at class A.

More specifically, an input stage having a low power field effect transistor that is biased substantially at its pinch off voltage, and in response to the presence of each RF pulse, the field effect transistor conducts during substantially every other half cycle of the signal. The average drain current covered by such operation turns on a switching transistor; and the turning on of the switching transistor biases a second stage field effect transistor from pinch off to a voltage that results in such second stage transistor providing class A amplification.

DESCRIPTION OF THE PREFERRED EMBODIMENT

Figure 1:
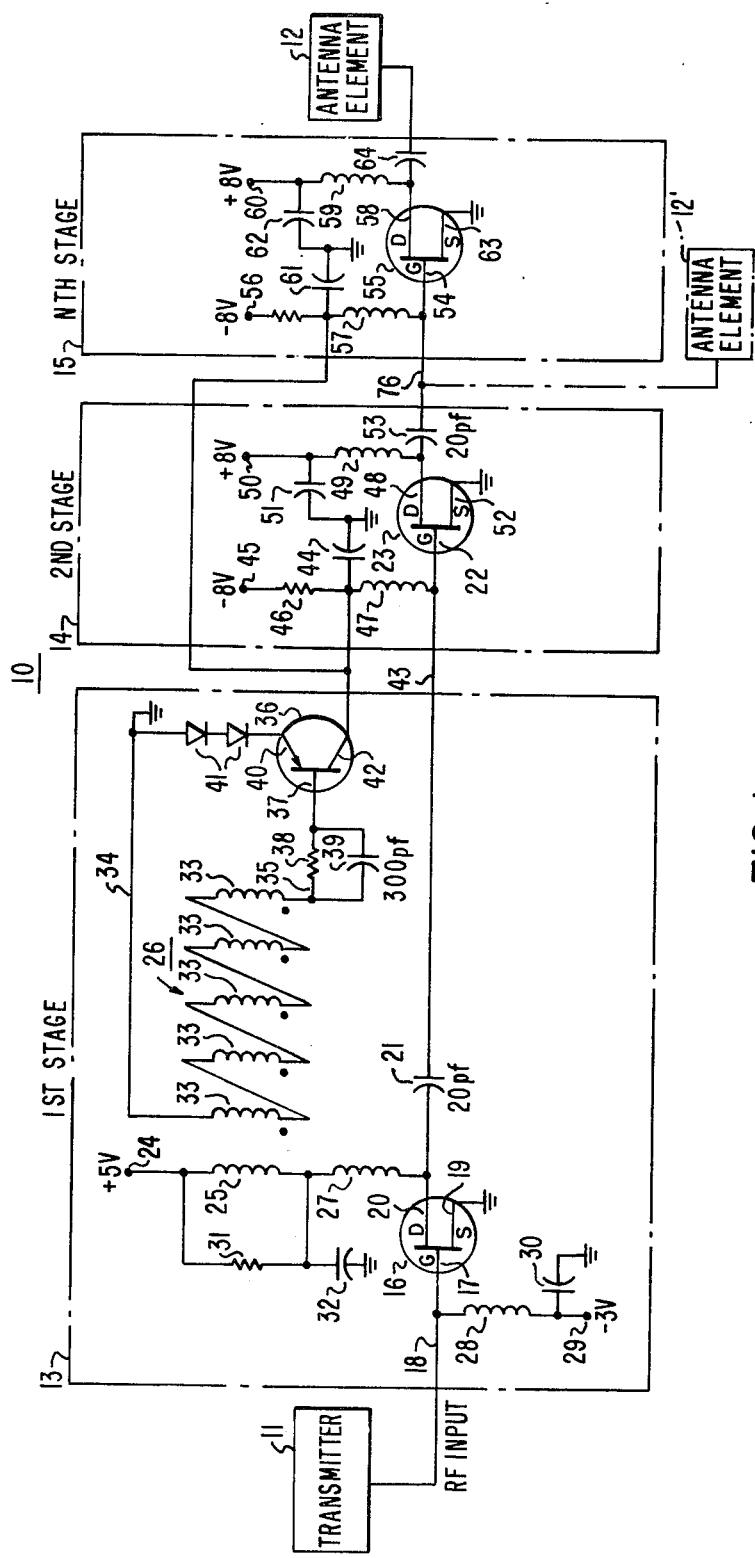
FIG. 1 is a schematic block diagram of a power amplifier in accordance with one embodiment of the present amplifier in accordance with one embodiment of the present invention.

Referring to FIG. 1, a microwave power amplifier, generally referred to as 10 may be connected to the RF output of a radar transmitter 11 to amplifythe pulsed signals for propagation via an antenna element 12. The amplifier 10 includesa first stage within the dashed line 13, a second stage within the dashed lines 14, and may include one or more subsequent N stages, one of which is shown within the dashed lines 15. In some applications, it may be desirable to include only an input stage 13 and a second stage 14, in which case, the output would be connected to an antenna element 12 and the stage 15 omitted. Typically, however, it is contemplated that four or five stages may be used.

The first stage 13 includes an amplifying depletion mode field effect transistor 16 which has a gate portion 17 connected to an RF input applying means 18 from the transmitter 11. The transmitter 16 is preferably a low noise low power transistor, such as a transistor of the type designated as NEC388, for example. By low power, is meant a field effect transistor that is commonly designated as such, which has a maximum power output in the neighborhood of ten milliwatts. The transistor 16 includes a source 19 which is connected to ground, and a drain 20 which is connected through a blocking capacitor 21, to a gate portion 22 of a second stage amplifying field effect transistor 23. The transistor 23 is preferably a medium power transistor, as such is commonly designated, which has a maximum power output in the neighborhood of one-half watt. In an actual reduction to practice, a field effect transistor designated as MSC88002 was utilized.

The transistor 16 is biased to pinch off when on RF pulse is present on its gate portion 17; but which turns on to amplify every other half cycle of an RF signal in response to the presence of an RF pulse from the transmitter 11. The transmitter 16 may be biased by a circuit that includes a means 24 for applying a suitable potential through a primary winding 25 of a transformer 26, and an inductor 27 to its drain 20. The biasing circuit is completed through an inductor 28 and a means for applying a voltage of opposite polarity from that applied at 24, which means is referred to at 29. The value of the voltage applied at 24 and at 29 is such that the transistor is biased substantially at "pinch-off", as previously mentioned. A capacitor 30 is connected at its one side to a junction between the inductor 28 and the voltage applying means 29, and in its other side to ground. The inductor 28 and the capacitor 30 function to provide a biasing filter to pass low frequency oscillations which may appear on the input 18 in a conventional manner.

A sampling resistor 31, which may be fifty ohms, for example, is connected across the primary winding 25 of the transformer 26 to provide an IR or voltage drop across the primary 25 in response to sensing the average drain current when the transistor 16 turns on in response to every other half cycle of the RF pulse. The inductor 27 in combination with the capacitor 32, which capacitor is connected at one side to ground and its other side to a junction between the primary winding 25 and the inductor 27 functions as a low pass filter for the biasing circuit to block the frequency of the RF pulses and pass any low frequencies.

The transformer 26 is preferably a ferrite core transformer, whch is commony known as a "Ruthroff" transformer. Such a transformer has been utilized in the present embodiment of the invention because it has a good transformation ratio, can be fabricated to be relatively small, and is suitable for narrow pulse widths. The transformer 26 includes secondary windings referred to at 33; and is so configured in the present embodiment of the invention to produce at its output connections 34 and 35 approximately 2 to 2½ volts in response to a ½ volt across the primary winding 25. A switching transistor 36 which is preferably a bipolar transistor that is capable of switching on and off in response to the respective presence and absence of each RF pulse, has a base portion 37 connected to the output 35 of the transformer 26 through a parallel connected resistor 38 and a capacitor 39. The transistor 36 has an emitter portion 40 that is connected through diodes 41 to the output 34 of the transformer 26. The resistor 38 and the capacitor 39 maintain a charge on the base 37 of the transistor 26 for the duration of a voltage pulse across the primary winding 25 so that the transistor 36 continues to conduct for the duration of each RF pulse. The diodes 41 are included to provide a −2 volts at the emitter portion 40 of the transistor 36. In response to a stepped-up voltage pulse on the outputs 34 and 35, the transistor 36 "turns on" to provide approximately a −2 volts at its collector portion 42. Thus, in the first stage 13 of the amplifier, the presence of an RF pulse on 18 causes the transistor 16, which is biased to pinch-off to be "turned-off" preferably for class B operation for the duration of such RF pulse. While such RF pulse is present, a voltage drop occurs across the sampling resistor 31 which drops the voltage across the primary 25, which in turn provides an output from the transformer 26 to cause the transistor 36 to conduct. Simutaneously, the "turning on" of the amplifying transistor 16 provides an amplified output of the RF siganl on its drain portion 20 which passes through the blocking capacitor 21 to output 43 of the first stage 13 of the amplifier 10.

The previously mentioned amplifying transistor 23 of the second stage 14 of the amplifier is also normally biased to its "pinched-off" voltage when the switching transistor 36 is not conducting, which as previously described is the case when no RF pulse is present on its gate portion 22. The transistor 23 is biased by a circuit, which includes a means 45 for applying a biasing voltage through an isolation resistor 46 and an inductor 47 to the gate 22 of the transistor 23. Such circuit is completed from the gate 22 through drain 48 and an inductor 49 to a means 50 for connecting to a voltage source of a polarity opposite to that at 45. The value of the voltage which may be applied to 45 and to 50 is −8 volts and +8 volts, respectively, for example. A capacitor 51 is connected to the voltage applying means 50 to function in combination with the inductor 49 as a low pass filter for blocking any RF frequencies on drain portion 48. A source 52 of the transistor 23 is connected to ground in the same manner as the transistor 16 of the first stage 13. The combination of the inductor 49 and a capacitor 44 also functions as a low power filter to block any RF frequencies on the gate 22. The drain 48 of the second stage amplifying transistor 23 may be connected through a blocking capacitor 53 directly to the antenna element 12' in a well known manner, or it may be applied to a Nth stage 15 via a gate portion 54 of a third stage amplifying field effect transistor 55.

The transistor 55 is biased to its pinch-offvoltage when no RF pulse is present in the same manner as that provided for the transistor 23 of the second stage. Such biasing circuit may include means 56 for connectingto a negative biasing source, an inductor 57 and the gate 54. Such circuit is completed from drain portion 58 of the transistor 55 through an inductor 59 to a means 60 for connecting to a plus voltage source. As in the second stage transistor, the value of the voltages on 56 and 60 may be −8 volts and +8 respectively. Capacitor 61 and 62 which are connected at the junction of the voltage applying means 57, 56 and 59, 60 respectively are used in combination with the respective inductors 57 and 59 as a low passing biasing filter. In the event that one or more N stages are used, such as a N stage 15 a blocking capacitor 64 is connected to the drain portion 58 of the transistor 55 for conventional connection to the antenna element 12. Source 63 of the transistor 55 is connected to ground in the same manner as the previous transistors 23 and 20. When the transistor 36 conducts, the transistor 23 is biased to its class A operating point by chaning the voltage on its gate 22 by a circuit which includes the collector portion 42 of the transistor 36 and the inductor 47 that is connected to the gate 22 from −8 volts to approximately −2 volts. This operating point may be any convenient point for amplification of the full cycle of the RF pulse where current is flowing in the drain 48 of the transistor 23 and preferably about midway between the maximum drain current $I_{DSS}$ and Ruthroff. Thus, the transistor 23 then amplifies the RF input applied to its gate 22 while such transistor is biased to ½ $I_{DSS}$ for class A operation. For subsequent stages, such as the $N^{th}$ stage 15, the conduction of the switching transistor 36 causes the transistors 55 to conduct at approximately ½ of the maximum drain current or at a value to effect desired class A operation in the same manner as described in connection with the transistor 23. It follows that the transistor 55 is biased to such operating points by changing the voltage on its gate 54 by a circuit which includes the collector portion 42 of the transistor 36 and the inductor 57 connected to the gate 54 from −8 volts to approximately −2 volts. Thus, the amplified RF pulse is applied to the gate 54, for application to the antennaelement 12 or to a subsequent stage. The field effect transistor 55 may be a high power transistor, which is meant to be one that has an output above ½ watt is customarily described.

Figure 2:
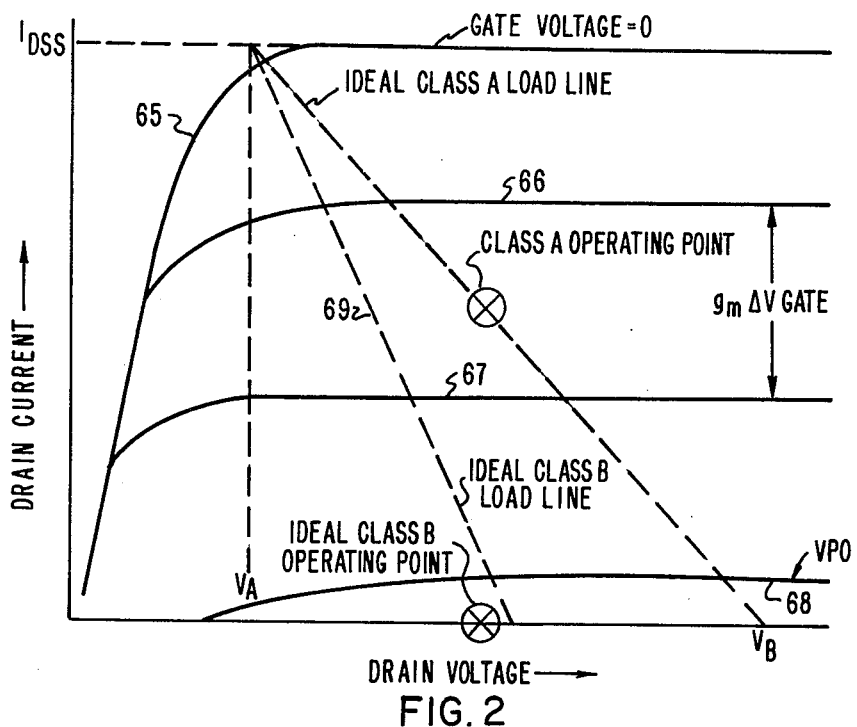
FIG. 2 is a graphical representation to illustrate drain voltage and current of the field effect transistors of two stages of the amplifier.

Referring to FIG. 2, the condition of the amplifying transistors FET is illustrated for their respective class A and class B operating points. The ordinate of the graphical representation represents the amplitude of drain current for a field effect transistor while the abscissa represents the drain voltage. A curve referred to at 65 illustrates the increase of drain currentas a function of drain voltage when the gate voltage is zero. As seen from FIG. 2, the drain current increases substantially relative to the increase of drain voltage when the gate voltage equals zero. When the operating point changes by a change of the voltage applied to the gate transistors, the maximum drain current $I_{DSS}$ is not reached as the drain voltage is increased as noted by curve 66 of FIG. 2. Curve 67 illustrates drain voltage as a function of drain current when the gate voltage is still more negative than is shown by gate 66. Here it is seen that the actual dran current of the device is substantially less than shown by the curve 66 or 65. Curve 68 is an ideal curve of the pinch-off gate voltage which illustrates that the drain current is nil and increases only slightly relative to any variations or increases in the drain voltage.

Thus as seen from FIG. 2, in connection with the previous description that the wide band or video pulsing circuit of the conventional power amplifiers is eliminated by gate biasing the amplifying transistors 16, 23, and 55 to pinch off which is represented by the line 68. In response to an RF pulse, the field effect transistor 16 of the first stage turns on every other half cycle giving rise to a positive drain current. The maximumload line for class B operation is illustrated in FIG. 2 by a dashed line referred to at line 69. The second stage field effect transistor 23, is biased to the class A operating point as shown in FIG. 2 in response to the switching on of the transistor 36 for the durationof any RF pulse which may be approximately midway between a zero and maximum gate voltage to draw during the presence of such RF pulse approximately ½ of the maximum drain current. Assuming that the criterion is used that in the entire RF cycle, the combined RF pulse and the DC biasing voltages never exceed the gate-drain breakdown voltage $V_B$ then the class B operating point is at the same voltage as the class A maximum power operating point. This is at, approximately:

$$I_{DRAIN} = I_{DSS}/2$$

$$V_{DRAIN} = (V_B - V_A)/2 + V_A$$

The average power, in the fundamental harmonic of the input signal, for such class B operation is given by $$P_{ar} = k/2\pi_0 \int^\pi \sin^3 wt \, d(wt) = 2k/3$$

$$k = (V_B - V_A)/2 I_{DSS}$$

and we integrated over the half cycle in which drain current flowed. Correspondingly, the class A maximum power output is ⅛$(V_B - V_A) I_{DSS}$. Thus the ratio of class B to A output power given by:

$$\frac{I_{DSS}(V_B - V_A)/3}{I_{DSS}(V_B - V_A)/8} = 0.85$$

In class B, however, the drive power applied to the gate circuit, being proportional to the peak gate voltage swing, is four times that required to generate maximum class A output. Thus, the gain for class B is down by $$10 \log_{10}(4/0.85) = 6.73 \, dB$$

Figure 3:
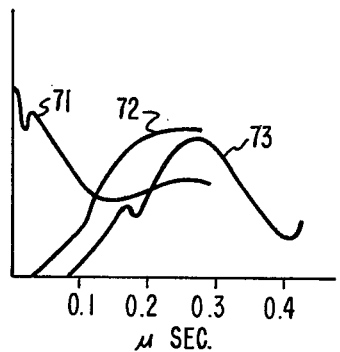
FIGS. 3 and 4 are graphical representation to illustrate the speed of response of the amplifier of FIG. 1.
Figure 4:
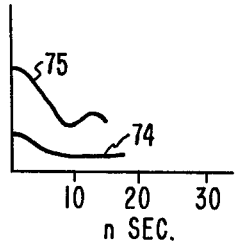

Referring to FIGS. 3 and 4, a graphical representation illustrates the effect of turn-on time for a power amplifier having two stages in accordance with the present invention. In FIG. 3, the detected output of the transistor 23 is illustrated by waveform 71 which shows its variation over a period of approximately three tenths of a microsecond. During this same pulse, waveform 72 is illustrative of the gate voltage of the transistor 23; and waveform 73 is illustrative of the drain current of the second stage amplifying transistor 23. The beginning of turn-on time or in other words the commencement of an RF pulse is at the extreme lefthand end as illustrated in FIG. 3. FIG. 4, which is drawn for a different time scale such as from zero to 30 nanoseconds. Waveform 74 illustrates the variations in amplitude of an RF pulse on the input 18 or applied to the gate 17 of the transistor 16 of the first stage; while waveform 75 illustrates the variations of amplitude of an amplified RF pulse on an output line 76 of the second stage 14 of the power amplifier 10.

In summary, the input RF pulse applied to the gate 17 of the field effect transistor 16 turns on the transistor 16 at substantially class B operation which transistor is gate biased to pinch off by the previously described circuit during the absence of an RF pulse. Although pinch-off voltage for class B operation is preferable, it is to be understood that such biasing may be below such pinch-off which in effect would result in class C operation. The drain current pulse that occurs in response to such RF pulse appears as a voltage across the resistor 31, which is stepped up through the transformer 26 to turn on the switching transistor 36, which transistor switches the gate of the field effect transistor 23 of the second stage and transistor 55 of the third stage from its pinch-off voltage to a voltage substantially above pinch off preferably one that corresponds to one half of the maximum drain current of the field effect transistor, which is referred herein as the biasing voltage for its class A operating point. Thus it is seen, that the power amplifier of FIG. 1 in accordance with the present invention draws no current except during the presence of an RF pulse, and requires no separate pulse signals or circuitry for driving the amplifier.

Although one embodiment of a power amplifier for a pulse radar transmitter has been described; and that the various components have been segregated into particular stages for convenience of description, it is to be understood that the components may be placed in stages other than the ones shown or that such stages may be combined. Also, certain voltage values have been shown for a specific embodiment, it is understood that other voltages may be used for pinch off, and class B and A operation in accordance with the particular transistors utilized or the particular results and applications desired. Further, although depletion-mode field effect transistors are preferred as the amplifying transistors and bipolar are preferred as the switching transistor, it is understood that other types of transistors may be used in the particular power amplifier in accordance with the claims herein without departing from the spirit or scope of the present invention.

We claim:

1. A self-pulsed microwave power amplifier for a radar transmitter, comprising
    a first and at least a second amplifying field effect transistor, each having source, drain, and gate portions,
    means for coupling the gate portion of the first transistor to the transmitter output,
    means for coupling the gate portion of the second transistor to one of the source and drain portions of the first transistor,
    means operative to bias the firsrt amplifying transistor at a voltage approximately no greater than its pinch-off voltage to cause said first transistor to provide approximately no greater than class B amplification in response to the presence of each RF input pulse from the transmitter,
    a switching transistor,
    means including the switching transistor responsive to the average current in one of the source and drain portions of the first transistor to bias the second transistor at a voltage sufficient to cause the second amplifying transistor to provide class A amplification,
    whereby the second amplifying transistor conducts during the full cycle of the RF signal from the output of the first amplifying transistor while the switching transistor is conducting.

2. A power amplifier according to claim 1 wherein the first and second amplifying transistors are depletion mode field effect transistors.

3. A power amplifier according to claim 1 or 2 wherein the switching transistor is a bipolar transistor.

4. A power amplifier according to claim 1 or 2 wherein the first amplifying transistor is a low power transistor, and the second amplifying transistor is a medium power transistor.

5. A power amplifier according to claim 1 wherein the means that includes the switching transistor is governed by the nonconduction of the switching transistor to bias the second amplifying transistor substantially at its pinch-off voltage.

6. A microwave power amplifier, comprising
    a first and at least a second field effect amplifying transistor,
    first means operatively connected to the first amplifying transistor to cause said transistor to conduct approximately during every other half cycle of an RF input signal applied thereto in response to the presence of such RF signal,
    a switching transistor,
    second means including a dropping resistor and a transformer having a primary winding electrically connected to one of the source and drain portions of the first amplifying transistor, said transformer having at least one secondary winding operatively connected to the switching transistor to cause said switching transistor to conduct in response to an increased voltage, said voltage in the primary winding being caused by conduction of the first amplifying transistor,
    third means operatively connecting the switching transistor to the second amplifying transistor to cause said second transistor to conduct a predetermined level of output current in response to the conducting of the switching transistor, and
    fourth means operatively connecting the first and second amplifying transistors to apply the amplified output signal from the first transistor to the second transistor,
    whereby the second amplifying transistor conducts during the full cycle of the RF signal from the output of the first amplifying transistor while the switching transistor is conducting.

7. A power amplifier according to claim 6 wherein the second means includes means to cause said second transistor to conduct at approximately one-half its maximum drain current in response to the conducting of the switching transistor.

* * * * *